United States Patent
Chen et al.

(10) Patent No.: US 9,306,495 B2
(45) Date of Patent: Apr. 5, 2016

(54) OSCILLATOR CIRCUIT AND RELATED METHOD

(71) Applicant: Taiwan Semiconductor Manufacturing Company, Ltd., Hsin-Chu (TW)

(72) Inventors: Guan-Yu Chen, Kaohsiung (TW); Wen-Yang Hsu, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 47 days.

(21) Appl. No.: 14/170,218

(22) Filed: Jan. 31, 2014

(65) Prior Publication Data
US 2015/0222229 A1   Aug. 6, 2015

(51) Int. Cl.
*H03B 5/32*   (2006.01)
*H03B 5/36*   (2006.01)

(52) U.S. Cl.
CPC .. *H03B 5/32* (2013.01); *H03B 5/36* (2013.01); *H03B 5/364* (2013.01); *H03B 2200/0066* (2013.01)

(58) Field of Classification Search
CPC .................................. H03B 5/36; H03B 5/364
USPC .......................... 331/158, 116 R, 116 FE, 175
See application file for complete search history.

(56) References Cited

U.S. PATENT DOCUMENTS

| | | | | |
|---|---|---|---|---|
| 5,923,222 A | * | 7/1999 | Russell et al. | 331/185 |
| 7,557,666 B2 | * | 7/2009 | Sugio | 331/116 R |
| 8,183,947 B2 | * | 5/2012 | Casagrande | 331/158 |
| 2008/0266009 A1 | * | 10/2008 | Liang et al. | 331/158 |

OTHER PUBLICATIONS

Lam, C.S., et al., "Aging Performance of Small Size MHZ Quartz Crystal Under High Drive," Symposium on Piezoelectricity, Acoustic Waves, and Device Applications (SPAWDA), Dec. 9-11, 2011, pp. 1-4.

* cited by examiner

*Primary Examiner* — Arnold Kinkead
(74) *Attorney, Agent, or Firm* — Slater & Matsil, L.L.P.

(57) ABSTRACT

A device includes a first pin configured to connect to a first terminal of a resonator, a second pin configured to connect to a second terminal of a resonator, a gain stage having a first terminal electrically connected to the first pin, and a voltage drop circuit. The voltage drop circuit includes a first transistor having an input terminal electrically connected to a second terminal of the gain stage, and a second transistor having an input terminal electrically connected to an output terminal of the first transistor, and an output terminal electrically connected to the second pin.

20 Claims, 4 Drawing Sheets

OSCILLATOR CIRCUIT AND RELATED METHOD

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrinking the process node towards the sub-20 nm node). Shrinking the semiconductor process node entails reductions in operating voltage and current consumption of electronic circuits developed in the semiconductor process node. For example, operating voltages have dropped from 5V to 3.3V, 2.5V, 1.8V, and even 0.9V.

A resonator is a discrete component that contains a piezoelectric material, such as quartz. The resonator generates an oscillating voltage with high Q (quality factor) and frequency that has low temperature correlation. The resonator is used in many electronic circuits as the basis for one or more clock signals.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely crystal oscillators and related methods. Other embodiments may also be applied, however, to other types of electronic circuits.

Throughout the various figures and discussion, like reference numbers refer to like objects or components. Also, although singular components may be depicted throughout some of the figures, this is for simplicity of illustration and ease of discussion. A person having ordinary skill in the art will readily appreciate that such discussion and depiction can be and usually is applicable for many components within a structure.

In the following disclosure, a novel oscillator and method are introduced. The oscillator uses series-connected N-type and P-type transistors to lower voltage applied to a resonator.

Figure 1:
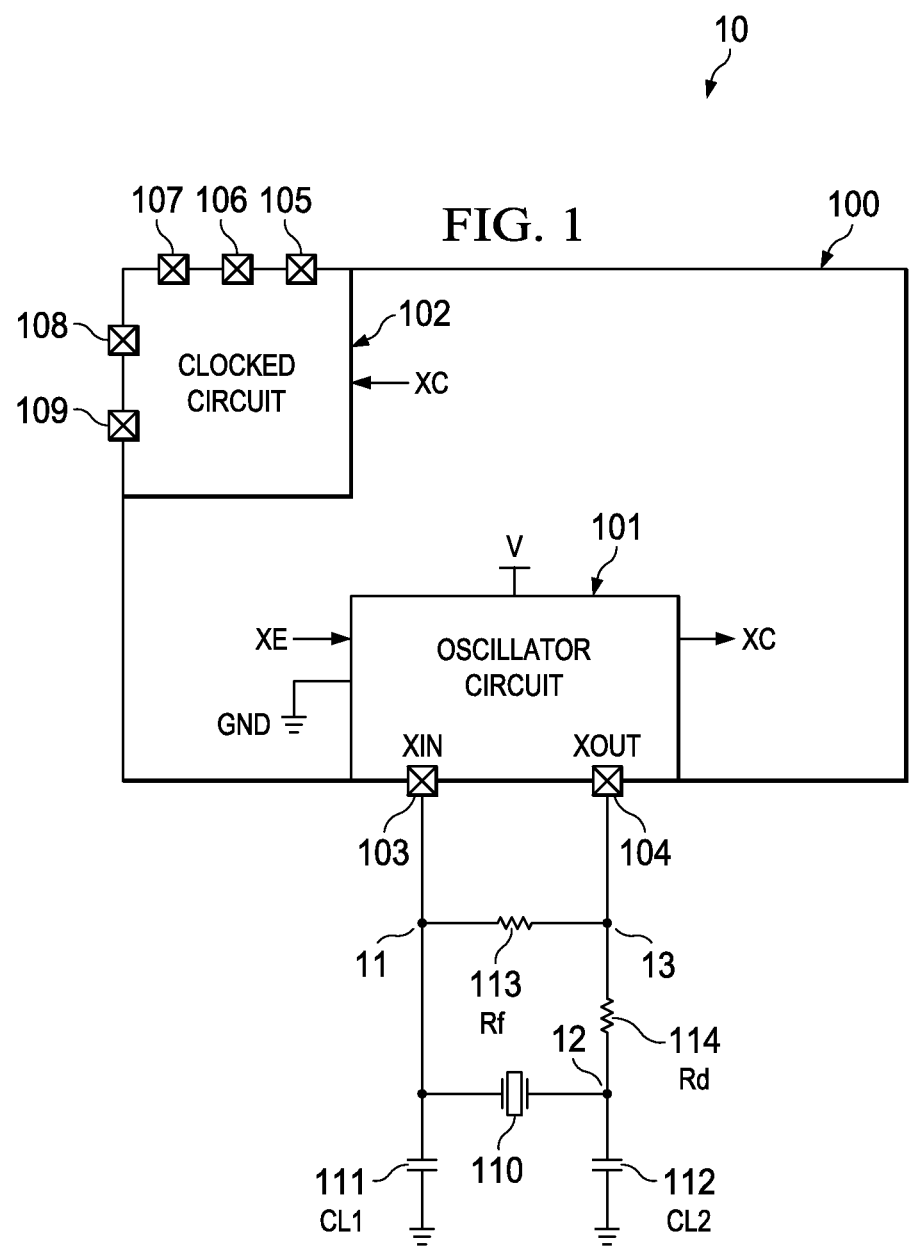
FIG. 1 is a diagram showing an electronic device in accordance with various embodiments of the present disclosure.

FIG. 1 is a diagram showing an electronic device 10 in accordance with various embodiments of the present disclosure. An integrated circuit (IC) 100 of the electronic device 10 is electrically connected to a resonator 110 of the electronic device 10. In some embodiments, the IC 100 includes at least one clocked circuit 102 and an oscillator circuit 101. The clocked circuit 102 is clocked by an output signal XC of the oscillator circuit 101. The oscillator circuit 101 generates the output signal XC based at least on resonant frequency of the resonator 110. In some embodiments, the electronic device 10 further includes at least one of a housing, a display, an input device (e.g., a touch screen), a display, speakers, or the like. In some embodiments, the electronic device 10 is a smartphone, a tablet computer, a personal computer, a game console, a set-top box, a portable electronic device, an automobile electronics system, an industrial apparatus, or the like.

In some embodiments, the resonator 110 is a crystal resonator, such as a quartz resonator or the like. A first capacitor 111 has a first terminal electrically connected to a first terminal (node 11) of the resonator 110. A second terminal of the first capacitor 111 is electrically connected to a power supply node (e.g., ground). A first terminal of a second capacitor 112 is electrically connected to a second terminal (node 12) of the resonator 110. A second terminal of the second capacitor 112 is electrically connected to the power supply node. The first capacitor 111 and the second capacitor 112 are discrete components. In some embodiments, the first terminal of the first capacitor 111 is electrically connected to the first terminal of the resonator 110 through a first printed circuit board (PCB) trace. In some embodiments, the first terminal of the second capacitor 112 is electrically connected to the second terminal of the resonator 110 through a second PCB trace.

In some embodiments, a first terminal of a first resistor (Rf) 113 is electrically connected to a crystal in pin (XIN) 103 of the integrated circuit 100. In some embodiments, a second terminal of the first resistor is electrically connected to a crystal out pin (XOUT) 104 of the integrated circuit 100. In some embodiments, the first resistor 113 is a feedback resistor. In some embodiments, the first resistor 113 is a discrete component. In some embodiments, electrical connections between the first resistor 113 and the resonator 110 and the crystal in pin 103 are made through PCB traces.

In some embodiments, a first terminal of a second resistor (Rd) 114 is electrically connected to the second terminal of the resonator 110. In some embodiments, a second terminal of the second resistor 114 is electrically connected to the crystal out pin 104. In some embodiments, the second resistor 114 is a damping resistor. In some embodiments, the second resistor 114 is a discrete component. In some embodiments, electrical connections between the second resistor 114 and the resonator 110 and the crystal out pin 104 are made through PCB traces. Some embodiments of the electronic device 10 do not include the second resistor 114. For example, the node 12 may be directly electrically connected to the node 13.

In some embodiments, the clocked circuit 102 includes at least a flip-flop, a register, a memory array, an imaging sensor, a processor core, a controller, a digital signal processor, a digital filter, a mixed-signal circuit, a radio frequency circuit, or the like. In some embodiments, the clocked circuit 102 is integrated into the IC 100 with the oscillator circuit 101. In some embodiments, the clocked circuit 102 is integrated into a second IC stacked with the IC 100 through, for example, a through-silicon via (TSV). In some embodiments, the clocked circuit 102 is integrated into a third IC attached to an interposer, and electrically connected to the IC 100. In some embodiments, pins 105-109 are integrated with the clocked circuit 102. For example, the clocked circuit 102 of FIG. 1 includes five pins 105-109. In some embodiments, the clocked circuit 102 includes fewer or more than the five pins 105-109 shown in FIG. 1. In some embodiments, the pins 105, 106 are power/ground pins, and at least one of the pins 107-109 is a signal pin. The clocked circuit 102 receives the output signal XC (clock signal) of the oscillator circuit 101, and has operation synchronized at least in part by the output signal XC.

In some embodiments, the oscillator circuit 101 is biased by a voltage V supplied by a first voltage supply node, and a second voltage node (e.g., ground). An enable signal XE enables or disables operation of the oscillator circuit 101. In some embodiments, the crystal in pin (XIN) 103 and the crystal out pin (XOUT) 104 are part of the oscillator circuit 101. The crystal in pin 103 provides access to the first terminal of the resonator 110, and the crystal out pin 104 provides access to the second terminal of the resonator 110. In some applications, the resonator 110 is sensitive to driving level (e.g., power, voltage, or current), and may be damaged or age more rapidly in the presence of an excessive driving level. In the extreme, the resonator 110 may shatter if driven too strongly. Injection power (one measure of driving level) can be expressed as:

$$Pc = \frac{R_m}{2}(2\pi f_p C_e V)^2, \quad (1)$$

where $f_p$ is resonant frequency, $C_e$ is effective capacitance, V is voltage applied to the resonator 110, and $R_m$ is motional resistance. From equation (1), it can be seen that reducing the voltage V is an effective way to reduce the injection power Pc.

Figure 2:
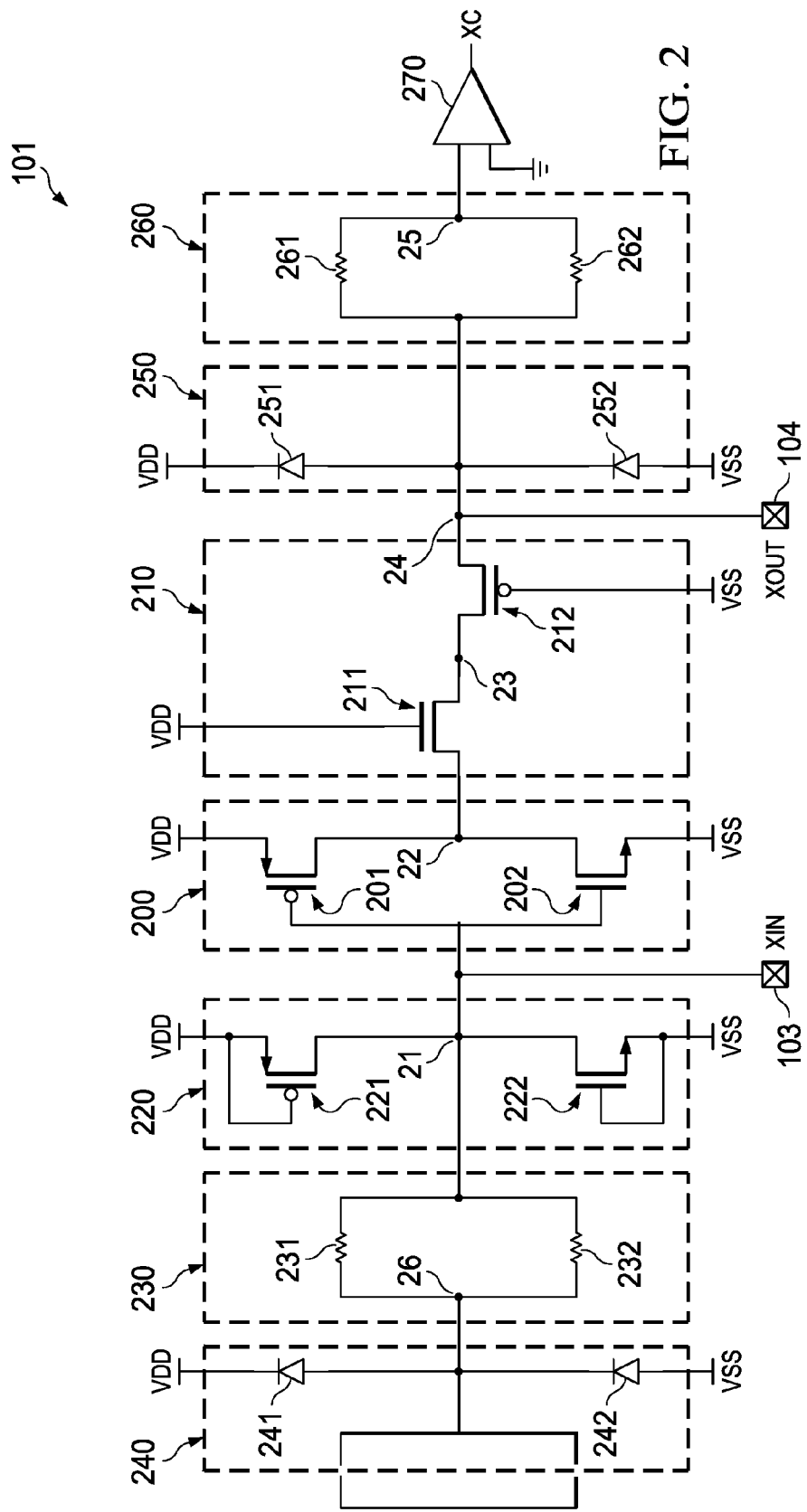
FIG. 2 is a diagram showing an oscillator circuit in accordance with various embodiments of the present disclosure.

FIG. 2 is a diagram showing the oscillator circuit 101 in accordance with various embodiments of the present disclosure. A gain stage 200 receives a crystal out signal of the resonator 110 through the crystal in pin 103. The gain stage 200 amplifies the crystal out signal to generate an amplified signal at the node 22. In some embodiments, the amplified signal is a rail-to-rail signal having amplitude that varies between about a first voltage VDD and a second voltage VSS. In some embodiments, the first voltage VDD is greater than the second voltage VSS by about 1.8 Volts.

In some embodiments, a second transistor 202 of the gain stage 200 is an N-type metal-oxide-semiconductor (NMOS) transistor. In some embodiments, a first transistor 201 of the gain stage 200 is a P-type metal-oxide-semiconductor (PMOS) transistor. A gate electrode of the first transistor 201 is electrically connected to the crystal in pin 103. A gate electrode of the second transistor 202 is electrically connected to the crystal in pin 103 and the gate electrode of the first transistor 201. A source electrode of the first transistor 201 is electrically connected to the first voltage supply node. A source electrode of the second transistor 202 is electrically connected to the second voltage supply node. A drain electrode of the first transistor 201 is electrically connected to a drain electrode of the second transistor 202 (at the node 22). When the crystal out signal at the node 21 is at a low voltage (e.g., about 0.85 Volts), the first transistor 201 conducts more strongly than the second transistor 202, and voltage level of the amplified signal is pulled up to about the first voltage VDD (e.g., 1.8 Volts). When the crystal out signal at the node 21 is at a high voltage (e.g., about 0.95 Volts), the second transistor 202 conducts more strongly than the first transistor 201, and the voltage level of the amplified signal is pulled down to about the second voltage VSS (e.g., 0 Volts).

A voltage drop circuit 210 is electrically connected to the node 22 and a node 24 corresponding to the crystal out pin 104. The voltage drop circuit 210 reduces swing of voltage at the node 24 (the crystal out pin 104) from about (VDD-VSS) to about (VDD-VSS-Vthn-Vthp), where Vthn is NMOS threshold voltage, and Vthp is PMOS threshold voltage. In some embodiments, a first transistor 211 of the voltage drop circuit 210 is an NMOS transistor. In some embodiments, a second transistor 212 of the voltage drop circuit 210 is a PMOS transistor. In some embodiments, the first transistor 211 is electrically connected to the node 22, and the second transistor 212 is electrically connected to the node 24. In some embodiments, a drain electrode of the first transistor 211 is electrically connected to the node 22. A gate electrode of the first transistor 211 is electrically connected to the first voltage supply node. In some embodiments, a source electrode of the first transistor 211 is electrically connected to a node 23.

Note that the output voltage of voltage drop circuit 210 drives node 24, which drive XOUT pin 104. XOUT pin 104 is connected (optionally via damping resistor 114) to the second terminal 112 or resonator 110. Recall that the voltage V across the resonator is an effective way to reduce the injection power Pc. By reducing the voltage to second terminal 112 or resonator 110, output drop circuit 210 effectively reduces the injection power Pc experienced by resonator 110, thus eliminating or reducing the risks of damage, decreased life, shattering, and the like to resonator 110.

In some embodiments, a drain electrode of the second transistor 212 is electrically connected to the node 24. A gate electrode of the second transistor 212 is electrically connected to the second voltage supply node. In some embodiments, a source electrode of the second transistor 212 is electrically connected to the source electrode of the first transistor 211 (the node 23).

In some embodiments, the oscillator circuit 101 further includes electrostatic discharge (ESD) protection circuits 220-260. In some embodiments, at least one of the ESD protection circuits 220-260 may be excluded from the electronic device 10. The ESD protection circuit 220 includes a first transistor 221 and a second transistor 222. In some embodiments, the first transistor 221 is a PMOS transistor. In some embodiments, the second transistor 222 is an NMOS transistor. A gate electrode of the first transistor 221 is electrically connected to the first voltage supply node. A source electrode of the first transistor 221 is electrically connected to the first voltage supply node. A drain electrode of the first transistor 221 is electrically connected to the node 21 corresponding to the crystal in pin 103.

A gate electrode of the second transistor 222 is electrically connected to the second voltage supply node. A source electrode of the second transistor 222 is electrically connected to the second voltage supply node. A drain electrode of the second transistor 222 is electrically connected to the node 21 corresponding to the crystal in pin 103.

A first resistor 231 of the ESD protection circuit 230 has a first terminal electrically connected to the node 21. A second terminal of the first resistor 231 is electrically connected to a node 26. A first terminal of a second resistor 232 of the ESD protection circuit 230 is electrically connected to the node 21. A second terminal of the second resistor 232 is electrically connected to the node 26.

A first diode 241 of the ESD protection circuit 240 has an anode electrically connected to the node 26. A cathode of the first diode 241 is electrically connected to the first voltage supply node. A cathode of a second diode 242 of the ESD protection circuit 240 is electrically connected to the node 26. An anode of the second diode 242 is electrically connected to the second voltage supply node.

A first diode 251 of the ESD protection circuit 250 has an anode electrically connected to the node 24. A cathode of the first diode 251 is electrically connected to the first voltage supply node. An anode of a second diode 252 of the ESD protection circuit 250 is electrically connected to the node 24. A cathode of the second diode 252 is electrically connected to the second voltage supply node.

A first resistor 261 of the ESD protection circuit 260 has a first terminal electrically connected to the node 24. A second terminal of the first resistor 261 is electrically connected to a node 25. A first terminal of a second resistor 262 of the ESD protection circuit 260 is electrically connected to the node 24. A second terminal of the second resistor 262 is electrically connected to the node 25.

Because the swing of the voltage at the node 24 is about (VDD-VSS-Vthp-Vthn), in some embodiments, a comparator 270 is included in the oscillator circuit 101. The comparator 270 provides rail-to-rail swing (e.g., from about VDD to about VSS) in the output signal XC, while avoiding leakage current. In some embodiments, a non-inverting input terminal of the comparator 270 is electrically connected to the node 25. In some embodiments, an inverting input terminal of the comparator 270 is electrically connected to ground. In some embodiments, the inverting input terminal of the comparator 270 is electrically connected to a reference voltage node carrying a reference voltage that is about half the difference between VDD and VSS (e.g., 0.9 Volts for VDD=1.8V and VSS=0V) instead of to ground as shown in the FIG. 2. In some embodiments, the comparator 270 is a hysteresis comparator (or includes hysteresis). In some embodiments, the comparator 270 is replaced with a gain stage similar to the gain stage 200. The gain stage 200 may include fewer transistors than the comparator 270, and may also introduce a tradeoff in greater leakage current.

Figure 3:
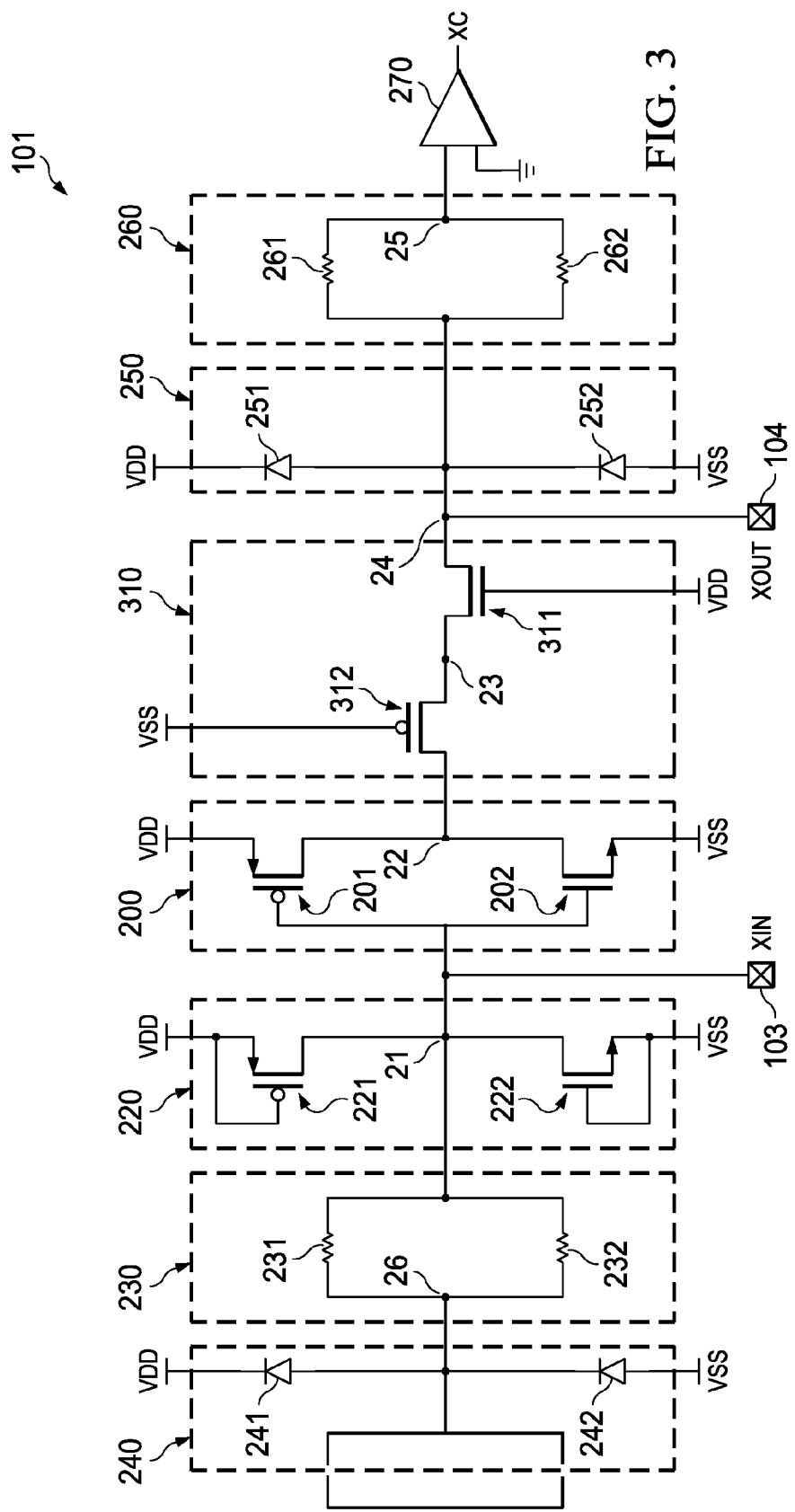
FIG. 3 is a diagram showing the oscillator circuit in accordance with various embodiments of the present disclosure.

FIG. 3 is a diagram of the oscillator circuit 101 in accordance with various embodiments of the present disclosure. The oscillator circuit 101 shown in FIG. 3 is similar in many aspects to the oscillator circuit 101 shown in FIG. 2. Like reference numerals refer to like elements. In some embodiments, the oscillator circuit 101 includes a voltage drop circuit 310 as shown in FIG. 3. In the voltage drop circuit 310, a first transistor 311 is an NMOS transistor, and is electrically connected to the node 23 and the node 24. A second transistor 312 is a PMOS transistor, and is electrically connected to the node 23 and the node 22. A source electrode of the first transistor 311 is electrically connected to the node 24. A drain electrode of the first transistor 311 is electrically connected to the node 23. A source electrode of the second transistor 312 is electrically connected to the node 22. A drain electrode of the second transistor 312 is electrically connected to the node 23. A gate electrode of the first transistor 311 is electrically connected to the first voltage supply node. A gate electrode of the second transistor 312 is electrically connected to the second voltage supply node.

Figure 4:
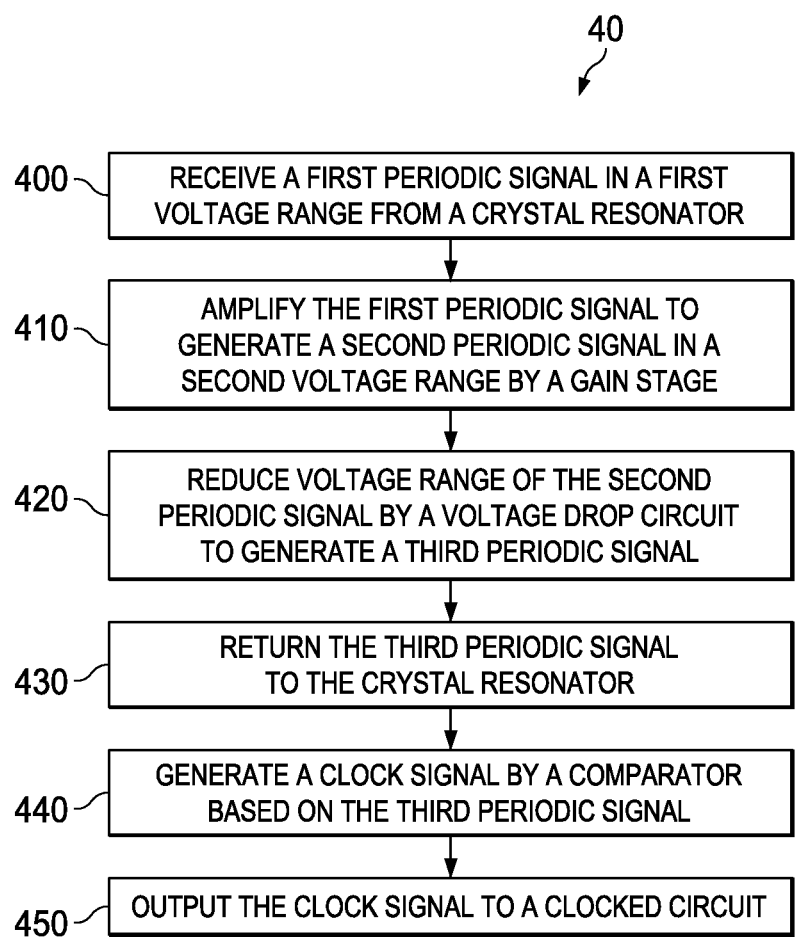
FIG. 4 is a flowchart of a method for generating an oscillating signal in accordance with various embodiments of the present disclosure.

FIG. 4 is a flowchart of a method 40 in accordance with various embodiments of the present disclosure. In some embodiments, the method 40 is performed by the electronic device 10 including the oscillator circuit 101 of either FIG. 2 or FIG. 3. In some embodiments, the method 40 is performed by the oscillator circuit 101 of either FIG. 2 or FIG. 3.

A first periodic signal is received 400 in a first voltage range from a resonator (e.g., the resonator 110). In some embodiments, the first voltage range is in the tens to hundreds of millivolts (e.g., 0.85-0.95 Volts, or 0-70 mV). In some embodiments, the first periodic signal is received 400 by an oscillator circuit (e.g., the oscillator circuit 101) through a crystal in pin, such as the crystal in pin (XIN) 103. In some embodiments, the first periodic signal oscillates at a frequency in the tens of megahertz (MHz).

The first periodic signal is amplified 410 to generate a second periodic signal in a second voltage range by a gain stage (e.g., the gain stage 200). In some embodiments, the gain stage 200 is an inverter circuit biased from a first voltage (e.g., VDD) to a second voltage (e.g., VSS). In some embodiments, the second voltage range is from about the first voltage to about the second voltage (e.g., about VDD-VSS). In some embodiments, frequency of the second periodic signal is substantially equal to the frequency of the first periodic signal.

Voltage range of the second periodic signal is reduced 420 by a voltage drop circuit (e.g., the voltage drop circuit 210 or the voltage drop circuit 310) to generate a third periodic signal having a third voltage range. In some embodiments, the reducing 420 is performed by an NMOS transistor in series with a PMOS transistor. In some embodiments, the reducing 420 reduces the voltage range of the second periodic signal by at least one NMOS threshold voltage and at least one PMOS threshold voltage. In some embodiments, the third periodic signal has substantially the same frequency as the second periodic signal.

The third periodic signal is returned 430 to the resonator. In some embodiments, the third periodic signal is returned 430 to the resonator through a crystal out pin (XOUT), such as the crystal out pin 104.

In some embodiments, a clock signal is generated 440 by a comparator (e.g., the comparator 270) based on the third periodic signal. In some embodiments, the clock signal has frequency substantially the same as the frequency of the third periodic signal. In some embodiments, the clock signal has voltage range larger than the voltage range of the third periodic signal. For example, the voltage range of the clock signal may be substantially the same as, or larger than, the voltage range of the amplified signal.

In some embodiments, the clock signal is outputted to a clocked circuit (e.g., the clocked circuit 102). In some embodiments, the clocked circuit is integrated with the oscillator circuit in a single IC. In some embodiments, the clocked circuit is integrated into a first IC stacked with a second IC including the oscillator.

Embodiments may achieve advantages. The voltage drop circuit 210 or 310 of the oscillator circuit 101 effectively reduces injection power to the resonator 110. The reduced injection power mitigates potential aging, frequency perturbation, or shattering of the resonator 110.

In accordance with various embodiments of the present disclosure, a device includes a first pin configured to connect to a first terminal of a resonator, a second pin configured to connect to a second terminal of a resonator, a gain stage having a first terminal electrically connected to the first pin, and a voltage drop circuit. The voltage drop circuit includes a first transistor having an input terminal electrically connected to a second terminal of the gain stage, and a second transistor having an input terminal electrically connected to an output terminal of the first transistor, and an output terminal electrically connected to the second pin.

In accordance with various embodiments of the present disclosure, a device includes a resonator and an oscillator circuit. The oscillator circuit includes a first pin electrically connected to a first terminal of the resonator, a second pin electrically connected to a second terminal of the resonator, a gain stage having a first terminal electrically connected to the first pin, and a voltage drop circuit having a first terminal electrically connected to a second terminal of the gain stage, and a second terminal electrically connected to the second pin.

In accordance with various embodiments of the present disclosure, a method includes: (a) receiving a first periodic signal in a first voltage range from a resonator; (b) amplifying the first periodic signal to generate a second periodic signal in a second voltage range by a gain stage; (c) reducing voltage range of the second periodic signal by a voltage drop circuit to generate a third periodic signal in a third voltage range; and (d) returning the third periodic signal to the resonator.

As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising". Moreover, the term "between" as used in this application is generally inclusive (e.g., "between A and B" includes inner edges of A and B).

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
   a first pin configured to connect to a first terminal of a resonator;
   a second pin configured to connect to a second terminal of a resonator;
   a gain stage having a first terminal electrically connected to the first pin and configured to receive an voltage signal from the first pin and to output an amplified voltage signal; and
   a voltage drop circuit receiving the amplified voltage signal from the gain stage and outputting to the second pin configured to connect to a second terminal of a resonator a reduced voltage signal, wherein the voltage drop circuit comprises an N-type transistor in series with a P-type transistor.

2. The device of claim 1, wherein:
   the N-type transistor has an input terminal electrically connected to a second terminal of the gain stage; and
   the P-type transistor has an input terminal electrically connected to an output terminal of the N-type transistor, and an output terminal electrically connected to the second pin.

3. The device of claim 1, wherein:
   a drain electrode of the N-type transistor is electrically connected to the second terminal of the gain stage; and
   a drain electrode of the P-type transistor is electrically connected to the second pin.

4. The device of claim 1, further comprising:
   a second gain stage having an input terminal electrically connected to an output terminal of the P-type transistor.

5. The device of claim 4, wherein the second gain stage is a comparator.

6. The device of claim 1, wherein the resonator is a crystal resonator.

7. A device comprising:
   a resonator; and
   an oscillator circuit comprising:
      a first pin electrically connected to a first terminal of the resonator;
      a second pin electrically connected to a second terminal of the resonator;
      a gain stage having a first terminal electrically connected to the first pin; and
      a voltage drop circuit having a first terminal electrically connected to a second terminal of the gain stage and a second terminal electrically connected to the second pin, wherein the voltage drop circuit comprises an N-type transistor in series with a P-type transistor.

8. The device of claim 7, wherein:
   the N-type transistor comprises:
      a gate electrode electrically connected to a first voltage supply node;
      a drain electrode electrically connected to the second terminal of the gain stage; and
      a source electrode; and
   the P-type transistor comprises:
      a gate electrode electrically connected to a second voltage supply node;
      a drain electrode electrically connected to the second pin; and
      a source electrode electrically connected to the source electrode of the N-type transistor.

9. The device of claim 7, wherein the oscillator circuit further comprises:
   a second gain stage electrically connected to the second terminal of the voltage drop circuit.

10. The device of claim 9, wherein the second gain stage is a comparator.

11. The device of claim 10, further comprising:
    a clocked circuit integrated with the oscillator circuit and configured to receive a clock signal based on output of the comparator.

12. The device of claim 7, further comprising:
    at least one electrostatic discharge protection circuit electrically connected to the first pin or the second pin.

13. A method comprising:
    (a) receiving a first periodic signal in a first voltage range from a resonator;
    (b) amplifying the first periodic signal to generate a second periodic signal in a second voltage range by a gain stage;
    (c) reducing voltage range of the second periodic signal by a voltage drop circuit having an N-type transistor in series with a P-type transistor, the voltage drop circuit generating a third periodic signal in a third voltage range; and
    (d) returning the third periodic signal to the resonator.

14. The method of claim 13, wherein:
    (a) includes receiving the first periodic signal from a crystal resonator.

15. The method of claim 13, wherein:
    (b) includes amplifying the first periodic signal to generate the second periodic signal by an inverter.

16. The method of claim 13, wherein:
(c) includes reducing the voltage range of the second periodic signal by at least one threshold voltage of the P-type transistor and one threshold voltage of the N-type transistor.

17. The method of claim 13, further comprising:
(e) generating a clock signal by a second gain stage based on the third periodic signal.

18. The method of claim 17, wherein:
(e) includes generating the clock signal by a comparator.

19. The method of claim 17, further comprising:
(f) outputting the clock signal to a clocked circuit.

20. The method of claim 19, wherein:
(f) includes outputting the clock signal to a digital circuit integrated in a same integrated circuit (IC) with the gain stage and the voltage drop circuit.

* * * * *